US008059832B2

(12) United States Patent
Kobayashi

(10) Patent No.: US 8,059,832 B2
(45) Date of Patent: Nov. 15, 2011

(54) AUDIO SIGNAL PROCESSING METHOD AND APPARATUS

(75) Inventor: Shinji Kobayashi, Chiba (JP)

(73) Assignee: Sony Corporation (JP)

( * ) Notice: Subject to any disclaimer, the term of this patent is extended or adjusted under 35 U.S.C. 154(b) by 1158 days.

(21) Appl. No.: 11/291,663

(22) Filed: Dec. 1, 2005

(65) Prior Publication Data

US 2006/0115093 A1 Jun. 1, 2006

(30) Foreign Application Priority Data

Dec. 1, 2004 (JP) ................................ P2004-349053

(51) Int. Cl.
*H04B 15/00* (2006.01)
*H03G 7/00* (2006.01)
*H04R 29/00* (2006.01)

(52) U.S. Cl. .......................... 381/94.9; 381/59; 381/106

(58) Field of Classification Search ................ 381/1, 55, 381/94.9, 59, 106, 107
See application file for complete search history.

(56) References Cited

U.S. PATENT DOCUMENTS

| | | | | |
|---|---|---|---|---|
| 4,815,354 | A | 3/1989 | Kunimoto | |
| 5,185,805 | A * | 2/1993 | Chiang | 381/96 |
| 5,481,617 | A | 1/1996 | Bjerre | |
| 5,506,910 | A | 4/1996 | Miller et al. | |
| 6,876,750 | B2 | 4/2005 | Allred et al. | |
| 6,954,538 | B2 | 10/2005 | Shiraishi | |
| 7,409,067 | B2 | 8/2008 | Yoshino | |

FOREIGN PATENT DOCUMENTS

| | | |
|---|---|---|
| EP | 0 404 117 A3 | 12/1990 |
| GB | 1114345 | 5/1968 |
| JP | 61-107298 | 5/1986 |
| JP | 63-266910 | 11/1988 |
| JP | 3074914 | 3/1991 |
| JP | 10-084595 | 3/1998 |
| JP | 2001/057697 | 2/2001 |
| JP | 2002-171589 A | 6/2002 |
| WO | 02/21687 | 3/2002 |
| WO | 02/41618 | 5/2002 |

OTHER PUBLICATIONS

Japanese Office Action issued on Apr. 1, 2008 in corresponding Japanese Application No. JP 2004-349053 (2 pages).
Japanese Office Action issued on Apr. 1, 2008 in connection with corresponding Japanese Application No. JP 2004-363570 (2 pages).

* cited by examiner

*Primary Examiner* — Vivian Chin
*Assistant Examiner* — Douglas Suthers
(74) *Attorney, Agent, or Firm* — Lerner, David, Littenberg, Krumholz & Mentlik, LLP

(57) ABSTRACT

When an inputted audio signal is outputted from a speaker device having a predetermined input-output characteristic, the predetermined input-output characteristic being selected such that the linearity of an output level with respect to an input signal is approximately assured at a level equal to a predetermined level or more and the output level with respect to the input signal is lowered at a level equal to the predetermined level or less, a correction process for compensating a lowered output level is carried out with respect to a signal component approximately of a level equal to the predetermined level or less in the inputted audio signal. Owing to the correction process, the reproduction characteristic of a small volume signal from a speaker is improved.

1 Claim, 7 Drawing Sheets

AUDIO SIGNAL PROCESSING METHOD AND APPARATUS

CROSS-REFERENCE TO RELATED APPLICATIONS

The present application claims priority from Japanese Patent Application No. JP 2004-349053 filed on Dec. 1, 2004, the disclosure of which is hereby incorporated by reference herein.

BACKGROUND OF THE INVENTION

The present invention relates to an audio signal processing method and apparatus which carry out characteristic correction in case of reproducing an audio signal from a speaker device and more particularly relates to a technology preferably to be applied in case of using a speaker device for HIFI reproduction by which reproduction of a high-quality sound is possible.

In the past, various kinds of constitutions were in practical use as a speaker device for HIFI reproduction by which reproduction of a high-quality sound is possible. For example, there is known a speaker device having a three-way constitution in which reproduction bands of the audio signal are divided into three bands of a low band, a middle band and a high band and individual speaker units are provided for respective bands thereof. Reproduction faithful to an input audio signal from a low band to a high band becomes possible in the speaker device having a three-way constitution by using units as speaker units for respective bands in which reproduction characteristics thereof are favorable in respective bands and generally, the reproduction characteristic thereof becomes favorable as compared with a so-called full-range type speaker unit which outputs audio of all bands by a single speaker unit.

Also, other than the constitution in which the reproduced sound of the speaker device is made to be a high-quality sound by adopting such a three-way constitution or a two-way constitution, there has been adopted a constitution in which the characteristic of the audio signal itself supplied to the speaker device is corrected on the side of an amplifier device which is an audio signal processing apparatus such that the audio characteristic outputted from the speaker device is to be improve accordingly. For example, there is a case in which a correction referred to as a loudness control is carried out by an audio amplifier device which performs a processing of amplification of an audio signal driving the speaker device or the like. This loudness control is a control for carrying out a correction process which strengthens a bass portion and a treble portion in the output level thereof as compared with a midrange portion such that a phenomenon that the bass and treble portions sound insufficiently mainly on an occasion of a small volume is to be corrected.

In Jap. Laid-Open Publication No. 2002-171589, there is a description with respect to one example of a reproducing constitution in case of carrying out a loudness correction.

However, the loudness controlled reproduced sound simply strengthens a signal in a specific frequency band approximately uniformly regardless of its level, so that it cannot be said in the strict sense of the word that a faithful reproduction with respect to the input audio signal is achieved and a development of a speaker device capable of achieving a more faithful reproduction with respect to the input audio signal has been desired. More specifically, since the reproduced sound which was loudness-controlled according to a conventional way strengthens a sound which cannot be caught easily on an occasion of a small volume to be reproduced, the bass portion and the treble portion become audible easily as compared with a reproduced sound which is not loudness-controlled and there is an effect of improving the sound quality to a certain degree, but the signal in a specific frequency band is to be strengthened uniformly regardless of a small level of a large level, so that it might happen that it may strengthen also with respect to a signal component which is unnecessary to be strengthened and as a result there is a case in which an unnatural reproduced sound is obtained.

Here, it will be explained with respect to a problem of the reproduced sound in a speaker device of related art, wherein there is a problem of a signal having a small amplitude as an example in a case when the reproduced sound does not reproduce the input audio signal faithfully. More specifically, for example, as shown in FIG. 1A, a case is assumed in which an input audio signal S1 of a continuous waveform having a waveform of a relatively large amplitude and a waveform of a relatively small amplitude. At that time, as a waveform of an audio signal S2 outputted from the speaker, it becomes approximately comparable with the input signal S1 with respect to a waveform of a relatively large amplitude and with respect to a waveform of a relatively small amplitude, there is a trend such that the amplitude thereof becomes smaller than that of the input signal S1. This is because the reproducing characteristic of a signal having small amplitude of a small volume is bad in a speaker unit having a shape provided with a general diaphragm capable of outputting in a relatively large sound and linearity of the input-output characteristic of a small volume signal cannot be assured.

Similarly as shown, for example, in FIG. 1B, when an input audio signal S3 having a waveform of a relatively large amplitude and an input audio signal S4 having a waveform of a relatively small amplitude overlap in time, an audio signal S5 composed by both the signals S3 and S4 is expected to be outputted primarily, but it becomes a state in which an output audio signal S6 having a waveform which is lowered in level as compared with the waveform of that composed signal S5 is to be outputted from the speaker. In a case, for example, when sounds of various musical instruments are to be reproduced concurrently such as a symphony as an audio to be reproduced from the speaker, such an output state may happen.

Further, as shown, for example, in FIG. 1C, in a case when there is an impulse signal as an input audio signal S7 in which a signal amplitude of a specific single frequency lowers gradually, it is true with respect to the waveform of an output audio signal S8 from the speaker that a following characteristic becomes deteriorated more as the level thereof becomes lower.

In any one of the examples of FIGS. 1A to 1*c*, the output level the signal having amplitude of a small volume becomes smaller than the input signal level with respect to the output from the speaker and it becomes a state in which linearity of a small signal cannot be maintained. When frequency-analyzing the state shown in FIGS. 1A to 1*c*, it becomes a state shown, for example in FIG. 2. The example of FIG. 2 is an example in which sensitivity is analyzed with respect to a fundamental wave f1 and its harmonics f 2 and f 3 which are higher harmonic waves of the fundamental wave. With respect to the fundamental wave f1 having a high level, it is outputted by a level as it was, but with respect to the harmonics f 2 and f 3 having smaller levels than the fundamental wave, the output sensitivities thereof become as shown by solid lines which are lowered than the primarily expected levels shown by dotted lines.

FIGS. 3A and 3B are drawings showing output characteristics from a low band to a high band in signal levels of a plurality of steps, wherein FIG. 3A shows an ideal characteristic and FIG. 3B is a drawing showing an output characteristic of an actual speaker. As shown in FIG. 3A, it is assumed in an ideal state such that four levels L1, L2, L3 and L4 were spaced approximately equally and it was a flat characteristic from a low band to a high band. At that time, with respect to the levels L1, L2 and L3 having high output levels for the output characteristic of an actual speaker shown in FIG. 3B, output characteristics approximately comparable with the ideal characteristic can be assured, but with respect to the characteristic of the lowest level L4, the levels are to be lowered from the primarily necessary levels by sensitivity a in any frequency bands.

The input-output characteristic diagram of FIG. 4 is a drawing when such sensitivity lowering is seen as a specific frequency characteristic. As shown in FIG. 4, while it is necessary primarily that the output level increased linearly with respect to the increase of the input signal level to the speaker so as to obtain a characteristic x of a dotted line, actually, the level changes approximately linearly in a level of a certain degree or more, but motion of the diaphragm with respect to the input is bad in a specific level or less such that a curved characteristic y is obtained in which the output sensitivity with respect to the input is very bad.

Specifically, in case of, for example, assuming that the maximum level for listening by a general speaker is to be 70 to 100 dBspl (sound pressure level), it can be said that a signal which is lowered from the maximum level by −30 dB to −60 dB does not output a sound volume which is correctly lowered by −30 dB to −60 dB with respect to the maximum level (is not proportional). Tentatively, when assuming a reproduction by a sound volume in which the output of the amplifier device is lowered from 100 dBspl by an amount of 50 dBspl, a sound volume before and after 50 dBspl should be obtained under an ordinary circumstance, but it happens actually, for example, that only an output of 40 dBspl which is lower than that by 10 dBspl can be obtained. In other words, it was recognized by an analysis of the present inventor that linearity cannot be fulfilled precisely and it becomes one of big causes for a phenomenon that a satisfied sound quality cannot be obtained.

It should be noted that the characteristic explained so far is the characteristic in case of a speaker unit having a relatively large diaphragm capable of outputting a relatively large sound volume, but conversely, in case of a speaker unit having a small sized and lightweight diaphragm which is produced for a small volume output such as, for example, a speaker unit for a headphone, there also exists a constitution in which linearity of the input-output is maintained relatively favorably on an occasion of a small volume and linearity of the input-output characteristic cannot be maintained on an occasion of a large sound volume.

SUMMARY OF THE INVENTION

The present invention was invented in view of above aspects and is directed to improving the reproduction characteristic from a speaker with respect to a small volume signal.

According to the present invention, an audio signal processing method carries out a correction process for outputting an inputted audio signal from a speaker device having a predetermined input-output characteristic, the predetermined input-output characteristic being selected such that the linearity of an output level with respect to an input signal is approximately assured at a level equal to a predetermined level or more and the output level with respect to the input signal is lowered at a level equal to the predetermined level or less. The method includes carrying out a correction process for compensating a lowered output level with respect to a signal component approximately of a level equal to the predetermined level or less in the inputted audio signal.

By doing this, an audio signal is outputted from a speaker device in which the input-output characteristic, corrected in conformity with the characteristic of the speaker device, is approximately linear and particularly, a signal of relatively small level whose output level becomes insufficient under a normal condition is outputted favorably by the primary level.

According to the present invention, an audio signal is outputted from a speaker device in which the input-output characteristic, corrected in conformity with the characteristic of the speaker device, is approximately linear and particularly, a signal of relatively small level whose output level becomes insufficient under a normal condition is outputted favorably by the primary level, so that it is possible to improve the reproduced sound quality remarkably.

In this case, a correction process compensates a lowered output level approximately uniformly within approximately all the frequency bands which the speaker device outputs, so that the reproduction characteristic can be improved in all the frequency bands, whereby it becomes possible to carry out a high-fidelity reproduction with respect to the input audio signal, which is quite different from the strengthening of only a specific band carried out from the past, such as a loudness control.

Also, it becomes possible to provide an audio signal processing apparatus with a relatively simple circuit having a filter, wherein the correction process can be carried out using the filter.

Also, it becomes possible to provide an audio signal processing apparatus with a transformer, wherein the correction process can be carried out using the transformer.

Also, it becomes possible to set an arbitrary compensation characteristic easily with a digital operation by correcting an input audio signal with a digital operation process.

DETAILED DESCRIPTION

Figure 5:
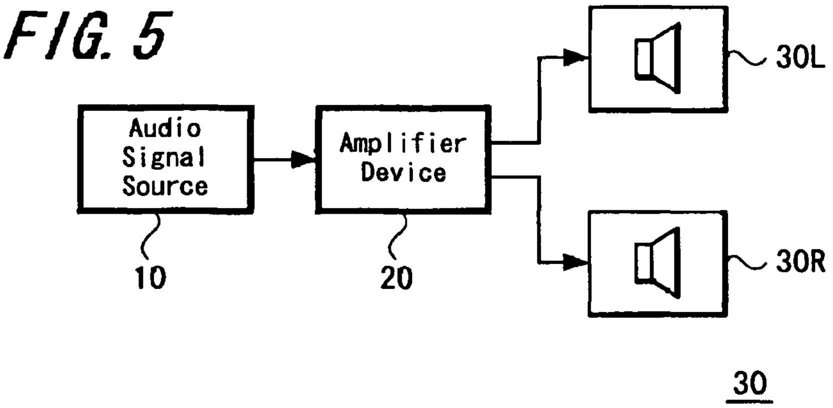
FIG. 5 is a block diagram showing a system constitutional example according to a first exemplified embodiment of the present invention.

Hereinafter, a first exemplified embodiment of the present invention will be explained with reference to FIGS. 5 to 8. FIG. 5 a drawing showing a system constitutional example according to this exemplified embodiment. In this example, there is shown a speaker device connected to an audio reproduction system and FIG. 5 is a drawing showing the whole system constitutional example. In this example, an audio signal source 10 is connected to an amplifier device 20, an audio signal recorded (stored) in a medium of a CD (disc), memory or the like is reproduced by the audio signal source 10, the reproduced and outputted audio signal is supplied to the amplifier device 20 and a process is carried out in the amplifier device 20 for making an audio signal which drives the speaker device.

In case of this example, the audio signal audio outputted from the signal source 10 is a signal of two channels consisting of an audio signal for the left channel and an audio signal for the right channel. The audio signal for the left channel outputted from the amplifier device 20 is supplied to a speaker device 30L for the left channel to be outputted and the audio signal for the right channel there-from is supplied to a speaker device 30R for the left channel to be outputted.

The speaker device 30L for the left channel and the speaker device 30R for the right channel are to be formed to have the same constitution fundamentally (however, there is also a case with respect to contour shapes in which they are slightly different such as in case of bilaterally-symmetric shapes). It should be noted according to the explanation below when it is to be explained with respect to the speaker devices 30L and 30R for the right and left channels without distinguishing the channel thereof that there is also a case in which it is described by the speaker device 30 put with a reference numeral excluding L or R.

It will be explained with respect to the constitution of each of the speaker devices 30L and 30R, wherein each of the respective speaker devices 30L and 30R is provided with one speaker unit 31 (FIG. 6) for a speaker unit as acoustic output means each for outputting audio. The each speaker unit 31 is a so-called full-range type speaker unit having approximately flat frequency characteristic in audible bands as characteristic seen from the outputted frequency bands and having characteristic in which it is outputted from a low band to a high band and it is constituted such that it is provided with a relatively large sized diaphragm and is a relatively large sized speaker unit capable of outputting a signal of a large sound volume. With respect to the speaker unit 31, the diaphragm is a relatively large, so that there is used such a unit in which linearity of input-output characteristic for a large signal equal to a predetermined level or more is approximately maintained, linearity of the input-output characteristic is not assured for the level equal to the predetermined level or less and the output signal level is inferior with respect to the input signal level.

Figure 4:
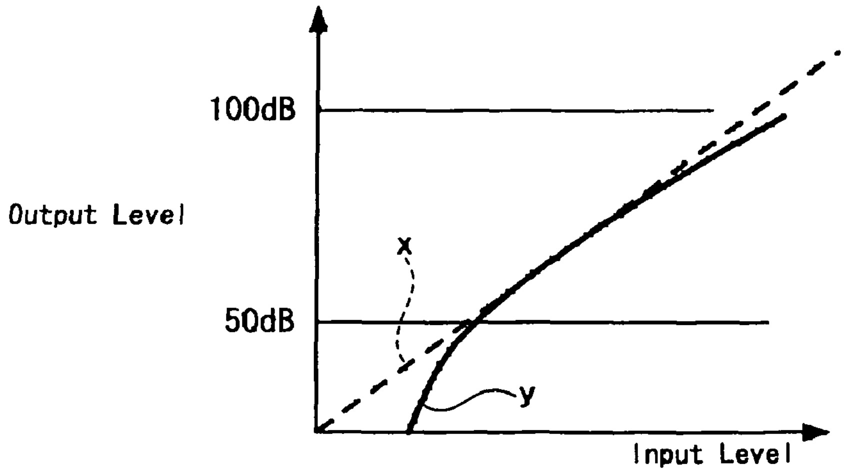
FIG. 4 (RELATED ART)
FIG. 4 is an explanatory diagram showing an example of input-output characteristic of a speaker of related art.

More specifically, a speaker unit having the characteristic y which is explained in the Background of the Invention with reference to FIG. 4 is to be used. A speaker unit possessing such a characteristic is a general unit as a speaker.

According to this example, it is constituted in an audio reproduction system in which the speaker device 30 using the speaker unit 31 possessing such a characteristic is connected such that a signal characteristic correction is carried out on the side of the amplifier device 20 which processes an audio signal to be supplied to the speaker device 30.

Figure 6:
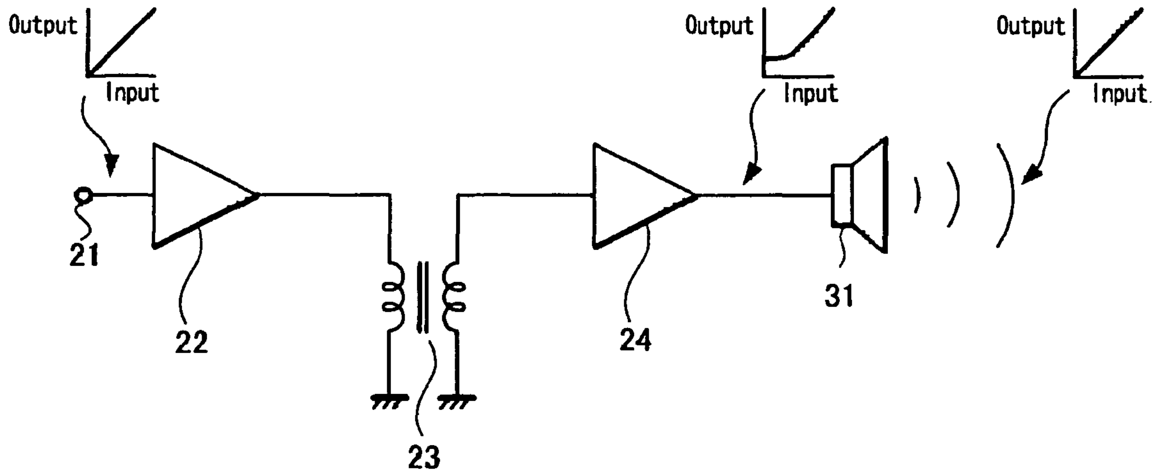
FIG. 6 is a constitutional diagram showing a constitutional example according to a first exemplified embodiment of the present invention.

FIG. 6 a drawing showing a constitution for a characteristic correction within the amplifier device 20 of this example and it shows a connection constitution until the speaker unit 31 which constitutes the speaker device 30. As shown in FIG. 6, the audio signal obtained at an audio signal input terminal 21 of the amplifier device is supplied through a buffer amplifier 22 to a primary side of a transformer 23 provided as characteristic correction means. Then, the signal obtained on the secondary side of the transformer 23 is supplied to an amplifier 24, amplified for a speaker drive and the amplified audio signal is supplied to the speaker unit 31 in the speaker device 30 so as to output an audio signal (sound emission). In the amplifier 24, for example, an amplification factor thereof is set variably in response to an adjustment state of a volume for sound volume adjustment (not shown). Alternatively, it may be constituted with respect to the sound volume adjustment such that it is to be executed by using another amplification means different from the amplifier 24.

Figure 7:
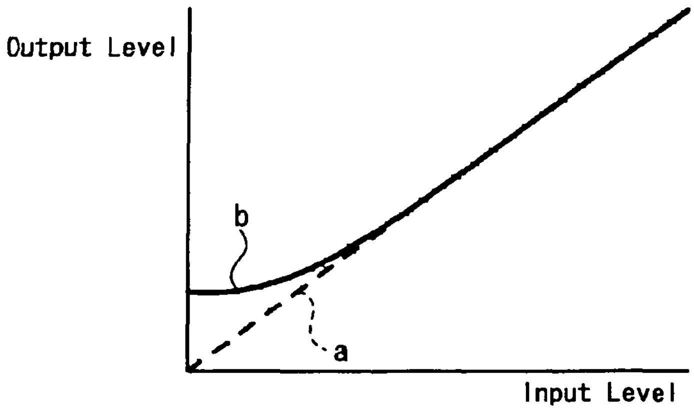
FIG. 7 is a characteristic diagram showing an example of compensation characteristic according to a first exemplified embodiment of the present invention.

FIG. 7 is a drawing showing a characteristic example corrected by the transformer 23. In FIG. 7, a characteristic a shown by a dotted line is a characteristic in which linearity is given such that increase and decrease of the input level and increase and decrease of the output level are linearly proportional to each other and it is shown just for reference. A characteristic b shown by a solid line is a characteristic corrected the transformer 23 according to this example.

As shown as the characteristic b, it is constituted when a signal is transmitted from the primary side to the secondary side such that the transformer 23 of this example has a characteristic in which linearity is given in a region equal to a predetermined level or more wherein increase and decrease of the input level and increase and decrease of the output level are linearly proportional (that is, characteristic approximately coincide with the characteristic a) and in the region equal to the predetermined level or less, the output level with respect to the input level has a characteristic shown by a curve in which the linearity is not given wherein the lower the level is the higher the rate of increase becomes as compared with a characteristic a.

Here, it is constituted with respect to a level position at which the straight line and the curve change in the characteristic b of the transformer 23 such that it approximately coincides with a level at the changing point between a level region in which linearity of the input-output characteristic is approximately maintained and a level region in which linearity of the input-output characteristic is not assured with respect to the characteristic of the connected speaker unit 31 (that is, predetermined level mentioned above). Specifically, in case of assuming that peak level of the audio signal is to be 0 dB and in a case when, for example, the region in which linearity of the input-output characteristic of the speaker unit 31 is assured is extended from 0 dB to −25 dB, it is constituted such that −25 dB is set to the predetermined level, the signal characteristic is not changed with respect to the region from 0 dB to −25 dB and characteristic b curve becomes true at −25 dB or less. Also, with respect to the characteristic which determines the curved shape of the characteristic b of the transformer 23, it is set to a characteristic in which the input and the output of the input-output characteristic of the speaker unit such as shown in FIG. 4 are reversed. Such a characteristic setting is executed, for example, by the shape, the quality of material or the like of the transformer 23.

It should be noted that the characteristic b shown in FIG. 7 shows a characteristic in a specific frequency and in case of this example, it is constituted such that the speaker unit 31 possesses approximately a similar characteristic in all of reproducible and audible bands.

Figure 8A:
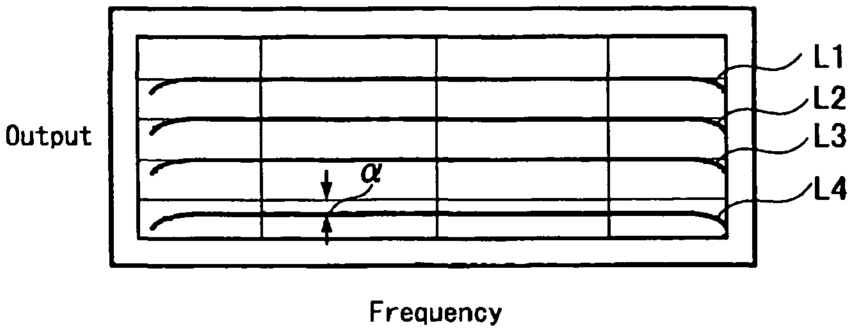
FIGS. 8A to 8C are characteristic diagrams showing an example of a correction state according to a first exemplified embodiment of the present invention in which output sensitivity at every frequency is shown.

FIG. 8 is a drawing showing a state in which an audio signal is outputted from the speaker device 30 by the correction the transformer 23 possessing such a characteristic as an output characteristic from a low band to a high band in a plurality of steps of the signal level. FIG. 8A is a drawing showing an output characteristic which the speaker device 30 itself of this example possesses (that is, output characteristic without being corrected). This FIG. 8A is same as the speaker characteristic shown in FIG. 3B of the Background of the Invention. More specifically, as shown in FIG. 8A, with respect to levels L1, L2 and L3 whose output levels are high, output characteristics approximately comparable with the ideal characteristic can be assured, but with respect to the output characteristic of the lowest level L4, the levels are to be lowered from the primarily necessary levels by sensitivity a in any frequency bands.

Figure 8B:
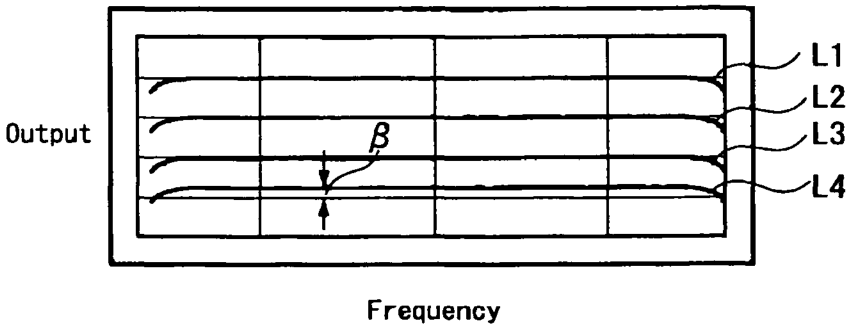

Here, a correction which becomes characteristic b shown in FIG. 7 in all frequency bands is carried out according to the correction in the amplifier device 20, so that when considered about the output characteristic of the signal inputted to the amplifier device 20, as shown in FIG. 8B, with respect to the levels L1, L2 and L3 having high output levels, they do not change from the input level, but with respect to the output characteristic of the lowest level L4, the levels are to be raised from the primary levels by sensitivity β in any frequency bands. Here, the sensitivity β which becomes high is to be set to a level for approximately compensating the sensitivity a which is lowered in the speaker device 30 and is shown in FIG. 8A.

Figure 1A:
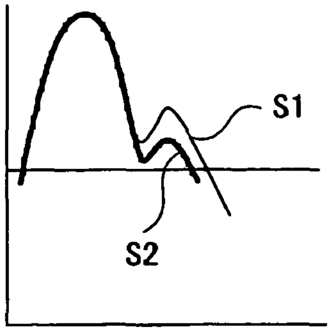
FIG. 1A (RELATED ART)
FIGS. 1A to 1C are explanatory diagrams showing an example of output waveforms of a speaker of related art.
Figure 1B:
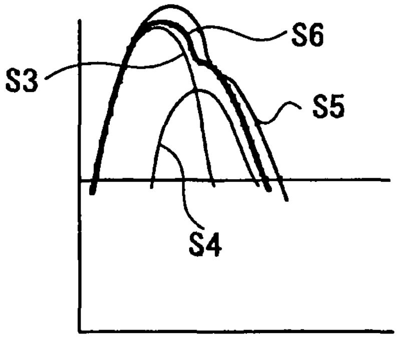
FIG. 1B (RELATED ART)
Figure 1C:
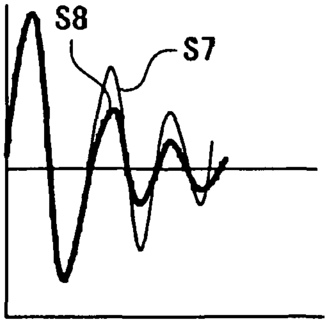
FIG. 1C (RELATED ART)
Figure 2:
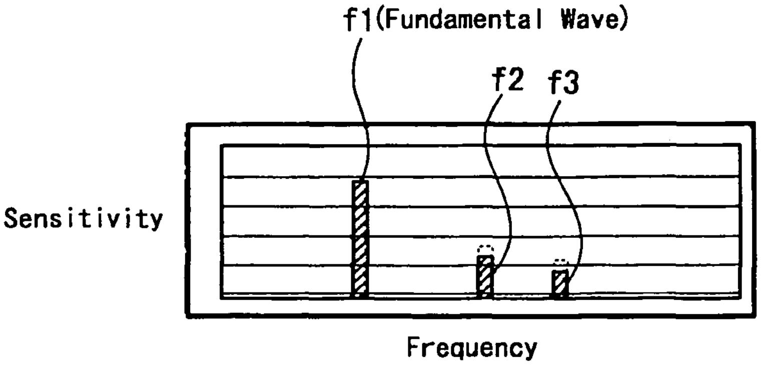
FIG. 2 (RELATED ART)
FIG. 2 is an explanatory diagram showing an example of signal level of a speaker of related art.
Figure 3A:
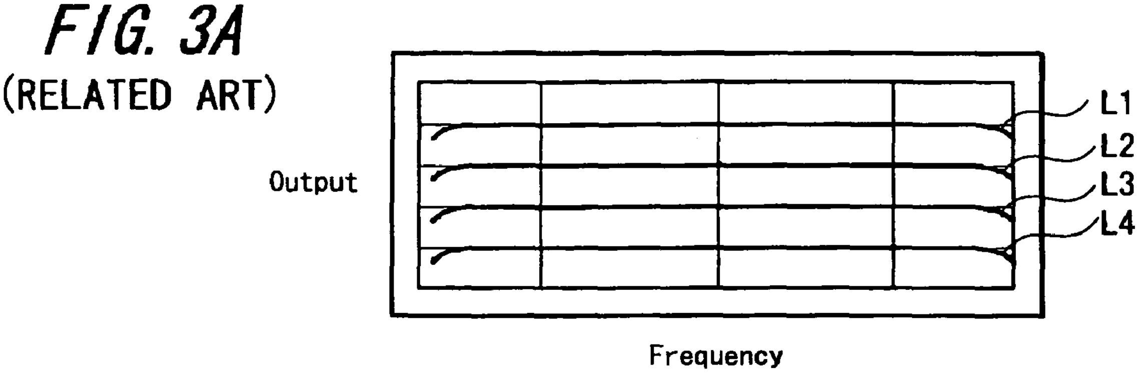
FIG. 3A (RELATED ART)
FIG. 3A is an explanatory diagram showing an example of output characteristic of an ideal speaker.
Figure 3B:
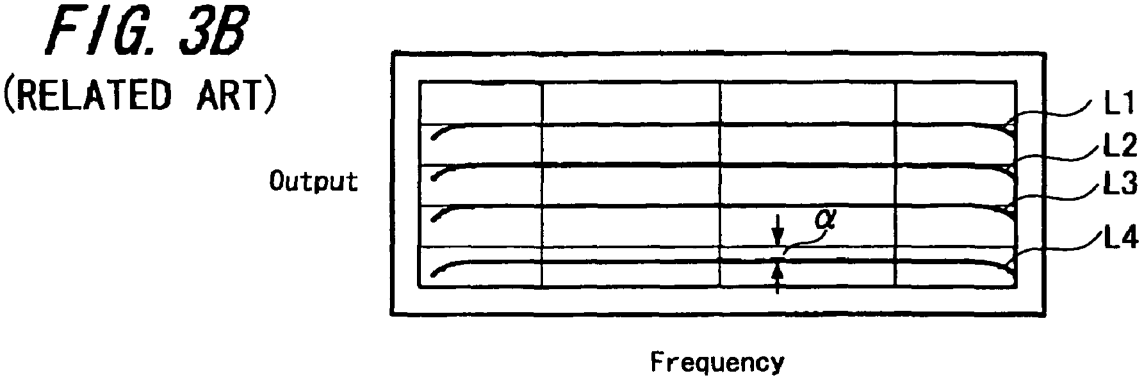
FIG. 3B (RELATED ART)
FIG. 3B is an explanatory diagram showing an example of output characteristic of a speaker of related art.
Figure 8C:
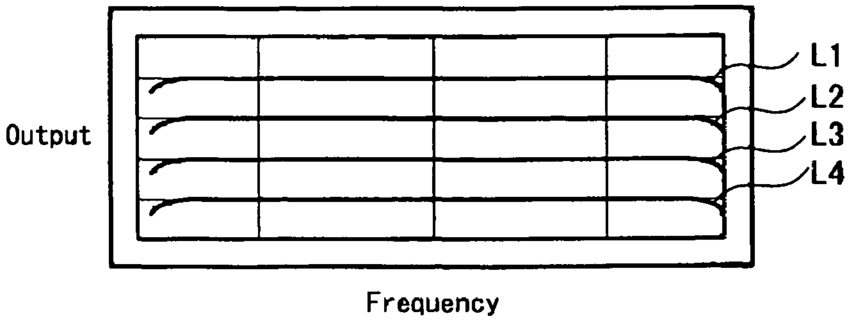

After making it as such a characteristic, the audio signal processed in the amplifier device 20 is outputted from the speaker device 30, so that with respect to the characteristic of the audio outputted from the speaker device 30, as shown in FIG. 8C, it becomes a characteristic in which the four levels L1, L2, L3 and L4 are spaced approximately equally and they are flat from a low band to a high band and becomes a favorable characteristic which is approximately equal to the ideal characteristic shown in FIG. 3A, in which the input and the output coincide with each other regardless of the amplitude thereof in all frequency bands.

Consequently, according to the audio reproduction system of the present invention, it is possible to output the reproduced audio signal of the audio signal source 10 from the speaker device 30 by a high-quality sound. Such a reproduction characteristic is a characteristic which is quite different from a process such as a loudness control known in the past in which the signal is strengthened with respect to the signal in a specific frequency band regardless of the level thereof and is a characteristic which carries out a reproduction faithful to the input audio signal.

It should be noted that the reproduction system of the present invention is applicable to various kinds of audio reproduction systems and in the example shown in FIG. 5, the audio signal source 10, the amplifier device 20 and the speaker device 30L and 30R are constituted in different bodies, but they may be constituted in an integrated system (apparatus). Alternatively, it may be constituted such that the input can be connected to an amplifier device without a correction processing function by installing correction means for correcting the characteristic of the speaker device (transformer or the like in the above-mentioned example) within the inside of the speaker device of a single body. Alternatively, it may also be constituted such that a similar correction is to be applied to the audio signal itself outputted from the audio signal source 10.

Also, for example, by applying an audio reproduction system of the present invention to a reproduction system for a so-called car stereo which is installed in a vehicle such as a car or the like, a sound of small level which may vanish into the noise generally will be caught easily in a reproduction environment in which the influence of noises outside the vehicle is large and the sound quality is improved.

Next, a second exemplified embodiment of the present invention will be explained with reference to FIG. 9. In this FIG. 9, the same reference numerals are put for portions corresponding to those in FIGS. 5 to 8 which were explained in the first exemplified embodiment.

Also in this exemplified embodiment, it is used as an audio reproduction system connected with a speaker device similarly as the first exemplified embodiment mentioned above and, for example, it is used by a system constitution shown in FIG. 5. As the speaker device to be connected, a speaker in which linearity of the input-output characteristic of a large signal equal to a predetermined level or more is maintained approximately, linearity of the input-output characteristic is not assured for the level equal to the predetermined level or less and the output signal level with respect to the input signal level is inferior is to be used.

Then, it is same as the first exemplified embodiment also with respect to an aspect which carries out the characteristic correction of the speaker device within the amplifier device 20. Here, in this exemplified embodiment, the characteristic correction means is made to have a different constitution from that of the first exemplified embodiment.

Figure 9:
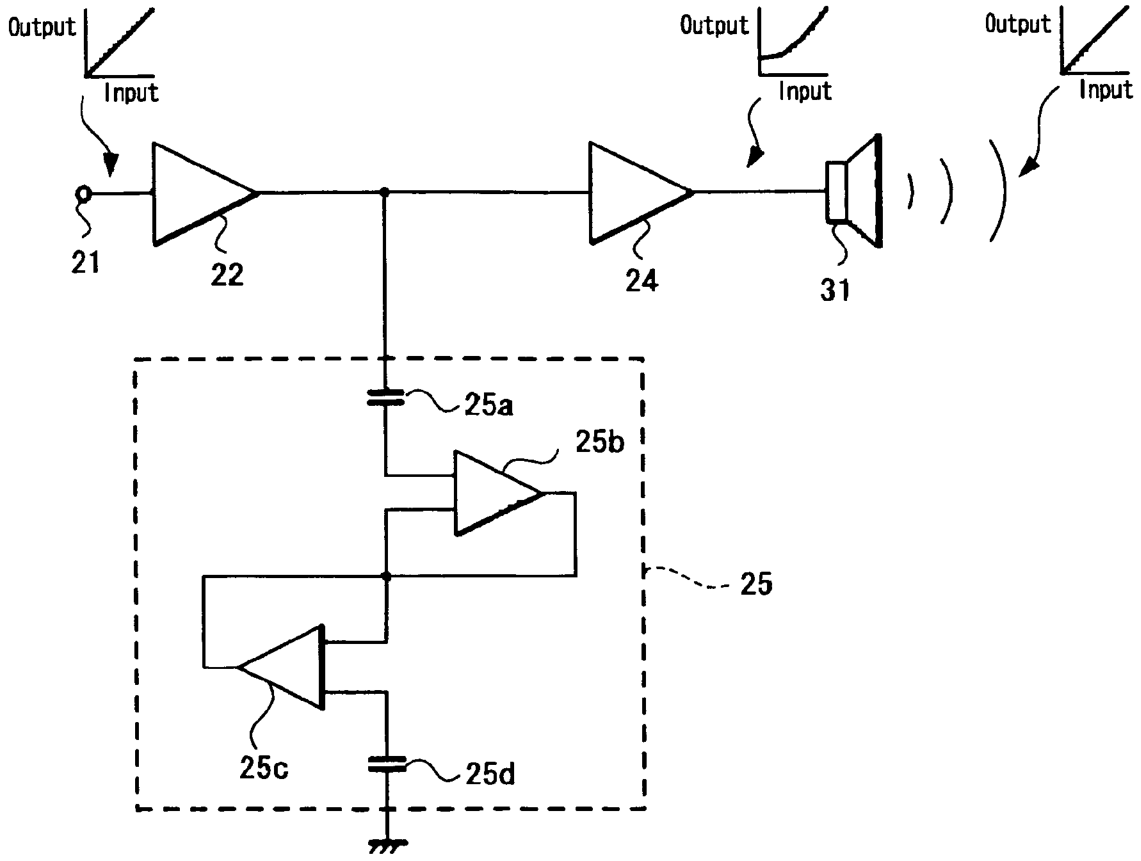
FIG. 9 is a constitutional diagram showing a constitutional example according to a second exemplified embodiment of the present invention.

FIG. 9 a drawing showing a constitution for a characteristic correction within the amplifier device 20 of the present invention, wherein there is shown a connection constitution until the speaker unit 31 which constitutes the speaker device 30. As shown in FIG. 9, an audio signal obtained at the input terminal 21 of the amplifier device is supplied to the amplifier 24 through the buffer amplifier 22 so as to be amplified for the speaker drive, and the amplified audio signal is supplied to the speaker unit 31 in the speaker device 30 and an audio signal is outputted (sound emitted).

Here, there is connected an active filter 25 constituted by an active element as correction means between the buffer amplifier 22 and the amplifier 24. In this active filter 25, a connection point of the buffer amplifier 22 and the amplifier 24 is connected to one of input terminals of an operational amplifier 25*b* through a capacitor 25*a*, and an output terminal of the operational amplifier 25*b*, the other of the input terminals, an output terminal of another operational amplifier 25*c* and one of input terminals thereof are connected and further, an input terminal of the operational amplifier 25 c is grounded through a capacitor 25*d*.

Depending on a fact that the active filter 25 having a constitution shown in this FIG. 9 is connected between the buffer amplifier 22 and the amplifier 24, a correction process for strengthening a signal level equal to a predetermined level or less determined by the filter characteristic is to be carried out for approximately all frequency bands of the input audio signal. With respect to the correction characteristic, it is determined by the characteristic, the constants or the like of the respective elements constituting the active filter 25.

Consequently, as the audio signal characteristic outputted from the speaker device 30 which is connected to the amplifier device 20, it is set to an input-output characteristic having linearity from a small level to a large level in which poorness in sensitivity which the speaker device 30 possesses with respect to a small level signal is corrected and a favorable audio reproduction can be realized. The corrected characteristic itself is based on a similar principle as the characteristic correction in the first exemplified embodiment explained with reference to FIG. 7 and FIG. 8.

Next, a third exemplified embodiment of the present invention will be explained with reference to FIG. 10. In this FIG. 10, the same reference numerals are put for the portions corresponding to those in FIG. 5 to FIG. 9 which were explained for the first and second exemplified embodiments.

Also in this exemplified embodiment, it is used as an audio reproduction system connected with a speaker device similarly as the first and second exemplified embodiments mentioned above and, for example, it is used by a system constitution shown in FIG. 5. As the speaker device to be connected, a speaker in which linearity of the input-output characteristic of a large signal equal to a predetermined level or more is maintained approximately, linearity of the input-output characteristic is not assured for the level equal to the predetermined level or less and the output signal level with respect to the input signal level is inferior is to be used.

Then, also with respect to amplifier the aspect that a characteristic correction of the speaker device is carried out in the device 20, it is similar as those of the first and second exemplified embodiments. Here, according to this exemplified embodiment, the characteristic correction means thereof is to have a different constitution from those of the first and second exemplified embodiments.

Figure 10:
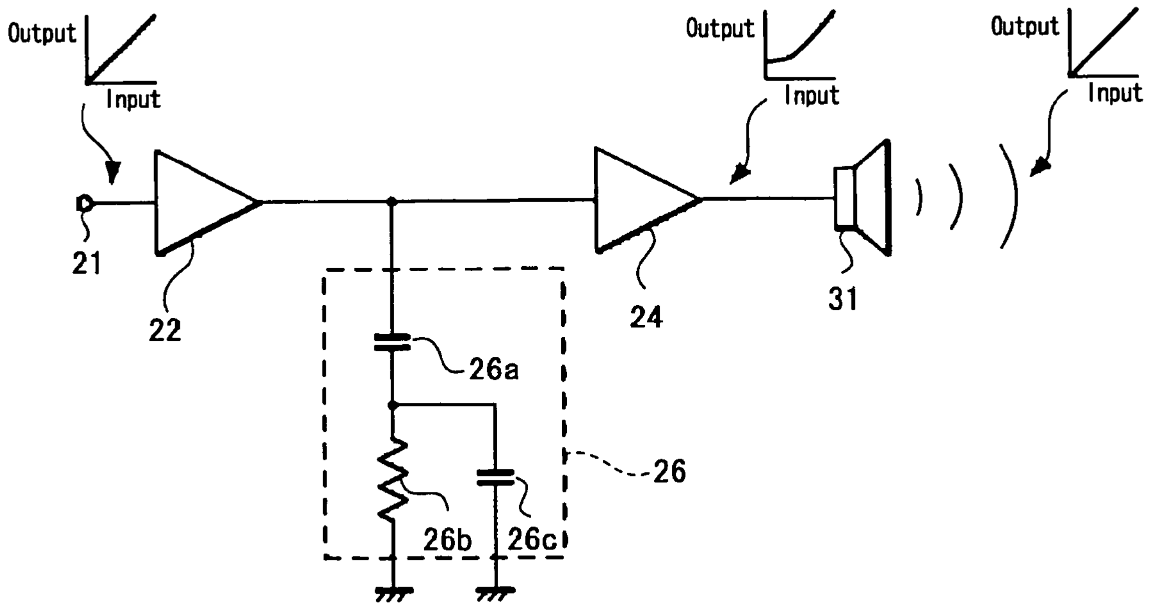
FIG. 10 is a constitutional diagram showing a constitutional example according to a third exemplified embodiment of the present invention.

FIG. 10 is a drawing showing a constitution for a characteristic correction in the amplifier device 20 of this example, wherein there is shown a connection constitution until the speaker unit 31 constituting the speaker device 30. As shown in FIG. 10, an audio signal obtained at the input terminal 21 of the amplifier device is supplied to the amplifier 24 through the buffer amplifier 22 so as to be amplified for the speaker drive, and the amplified audio signal is supplied to the speaker unit 31 in the speaker device 30 and an audio signal is outputted (sound emitted).

Here, there is connected a filter 26 constituted by a passive element as correction means between the buffer amplifier 22 and the amplifier 24. In this filter 26, a connection point of the buffer amplifier 22 and the amplifier 24 is grounded through a capacitor 26*a* and a resistor 26*b* and at the same time, a connection midpoint of the capacitor 26*a* and the resistor 26*b* is grounded through a capacitor 26*c*.

Depending on a fact that the filter 26 having a constitution shown in this FIG. 10 is connected between the buffer amplifier 22 and the amplifier 24, a correction process for strengthening a signal level equal to a predetermined level or less determined by the filter characteristic is to be carried out for approximately all frequency bands of the input audio signal. With respect to the correction characteristic, it is determined by the characteristic, the constants or the like of the respective elements constituting the filter 26.

Consequently, as the audio signal characteristic outputted from the speaker device 30 which is connected to the amplifier device 20, it is set to an input-output characteristic having linearity from a small level to a large level in which poorness in sensitivity which the speaker device 30 possesses with respect to a small level signal is corrected and a favorable audio reproduction can be realized. The corrected characteristic itself is based on a similar principle as the characteristic correction in the first exemplified embodiment explained with reference to FIG. 7 and FIG. 8.

Next, a fourth exemplified embodiment of the present invention will be explained with reference to FIG. 11. In this FIG. 11, the same reference numerals are put for the portions corresponding to those in FIG. 5 to FIG. 10 which were explained for the first, second and third exemplified embodiments.

Also in this exemplified embodiment, it is used as an audio reproduction system connected with a speaker device similarly as the first, second and third exemplified embodiments mentioned above and, for example, it is used by a system constitution shown in FIG. 5. As the speaker device to be connected, a speaker in which linearity of the input-output characteristic of a large signal equal to a predetermined level or more is maintained approximately, linearity of the input-output characteristic is not assured for the level equal to the predetermined level or less and the output signal level with respect to the input signal level is inferior is to be used.

Then, also with respect to amplifier the aspect that a characteristic correction of the speaker device is carried out in the device 20, it is similar as those of the first, second and third exemplified embodiments. Here, according to this exemplified embodiment, the characteristic correction means thereof is to have a different constitution from those of the first, second and third exemplified embodiments and specifically, it is constituted by combining by combining respective means explained in the first, second and third exemplified embodiments.

Figure 11:
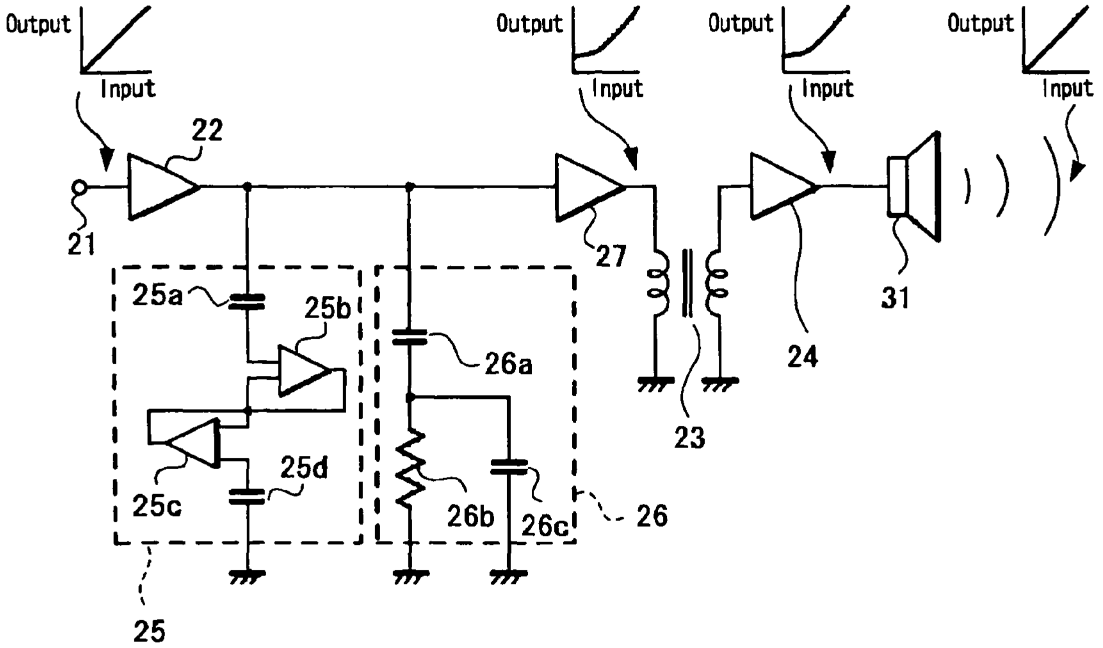
FIG. 11 is a constitutional diagram showing a constitutional example according to a fourth exemplified embodiment of the present invention.

More specifically, as shown in FIG. 11, an audio signal obtained at the input terminal 21 of the amplifier device is connected to the primary side of a transformer 23 which operates as a correction means through the buffer amplifiers 22 and 27, the secondary side of the transformer 23 is connected to the amplifier 24 so as to amplify it in the amplifier 24 for the speaker drive, the amplified audio signal is supplied to the speaker unit 31 in the speaker device 30 and an audio signal is outputted (sound emitted).

Here, there are connected an active filter 25 constituted by an active element and a filter 26 constituted by a passive element as correction means between the buffer amplifier 22 and the amplifier 24. The circuit configurations of the active filter 25 and the filter 26 are same as the constitutions explained in FIG. 9 and FIG. 10 respectively.

Depending on a fact that the transformer 23, the active filter 25 and the filter 26 are connected as a constitution shown in this FIG. 11, the correction of the input audio signal is carried out according to the overall characteristic in these mean 23, 25 and 26 and a correction process for strengthening a signal level equal to a predetermined level or less determined by the characteristic of these means is to be carried out for approximately all frequency bands of the input audio signal.

Consequently, as the audio signal characteristic outputted from the speaker device 30 which is connected to the amplifier device 20, it is set to an input-output characteristic having linearity from a small level to a large level in which poorness in sensitivity which the speaker device 30 possesses with respect to a small level signal is corrected and a favorable audio reproduction can be realized. The corrected characteristic itself is based on a similar principle as the characteristic correction in the first exemplified embodiment explained with reference to FIG. 7 and FIG. 8.

In case of this example, it is for the correction means constituted by a plurality of circuit parts (means), so that the compensation characteristic can be selected minutely by selecting characteristics of respective parts and it becomes possible to set the compensation characteristic minutely in conformity with the input-output characteristic of the connected speaker device.

Next, a fifth exemplified embodiment of the present invention will be explained with reference to FIG. 12. In this FIG. 12, the same reference numerals are put for portions corresponding to those in FIGS. 5 to 11 which were explained in the first, second, third and fourth exemplified embodiments.

Also in this exemplified embodiment, it is used as an audio reproduction system connected with a speaker device similarly as the respective exemplified embodiments mentioned above and, for example, it is used by a system constitution shown in FIG. 5. As the speaker device to be connected, a speaker in which linearity of the input-output characteristic of a large signal equal to a predetermined level or more is maintained approximately, linearity of the input-output characteristic is not assured for the level equal to the predetermined level or less and the output signal level with respect to the input signal level is inferior is to be used.

Then, also with respect to amplifier the aspect that a characteristic correction of the speaker device is carried out in the device 20, it is similar as those of the respective exemplified embodiments mentioned above. Here, it is constituted in this exemplified embodiment such that it is carried out for the characteristic correction means by a digital signal process.

Figure 12:
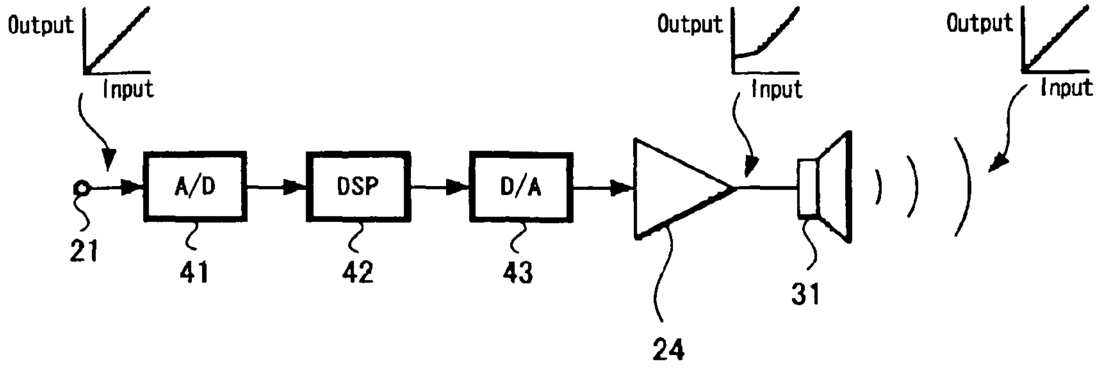
FIG. 12 is a constitutional diagram showing a constitutional example according to a fifth exemplified embodiment of the present invention.

More specifically, as shown in FIG. 12, the audio signal obtained at the audio signal input terminal 21 of the amplifier device is supplied to an analog/digital converter 41 so as to be converted to a digital audio signal and the converted digital audio signal is supplied to a DSP (digital-signal-processor) 42. Then, a correction process explained in the first exemplified embodiment is carried out by the digital operation process in this DSP 42. More specifically, for example, a signal component equal to a predetermined level or more and a signal component of less than the predetermined level are separated by the digital operation process with respect to all the frequency bands and with respect to the signal component equal to the predetermined level or more, no correction process is to be carried out. Then, with respect to the signal component of less than the predetermined level, a correction process is to be carried out by a digital operation such that a characteristic shown by the curve b (FIG. 7) without linearity is obtained in which the lower the level of the output level becomes with respect to the input level, the higher the increasing rate becomes as compared with a characteristic a. Then, the signal component equal to the predetermined level or more for which a correction process is not carried out and the signal component of less than the predetermined level for which a correction process was carried out are composed and the composed signal is supplied to a digital/analog converter 43 so as to be converted to an analog audio signal.

The converted analog audio signal is supplied to the amplifier 24 so as to be amplified for the speaker drive, the amplified audio signal is supplied to the speaker unit 31 in the speaker device 30 and an audio signal is outputted (sound emitted).

Depending on a fact that it is corrected in a digital operation process by taking a constitution shown in this FIG. 12, a correction process for strengthening a signal level of less than a predetermined level determined by the state of the digital operation process is to be carried out for approximately all frequency bands of the input audio signal.

Consequently, as the audio signal characteristic outputted from the speaker device 30 which is connected to the amplifier device 20, it is set to an input-output characteristic having linearity from a small level to a large level in which poorness in sensitivity which the speaker device 30 possesses with respect to a small level signal is corrected and a favorable audio reproduction can be realized. The corrected characteristic itself is based on a similar principle as the characteristic correction in the first exemplified embodiment explained with reference to FIG. 7 and FIG. 8.

In case of this example, it is a constitution in which the correction means carries out a digital operation process, so that a proper correction can be executed if the correction condition in the DSP 42 is made to be in conformity with the input-output characteristic of the connected speaker device.

It should be noted that application to a system for a two channels audio reproduction shown in FIG. 5 was assumed in the respective exemplified embodiments mentioned above, but it may be constituted as a system for a multi channel audio reproduction such as the 5.1 channel or the like.

Also with respect to the installed environment of the speaker device, it is applicable to various kinds of installed environments. For example, it may be constituted such that a correction in a case when sound is outputted from a speaker device of a so-called car stereo installed in a vehicle such as a car or the like is to be carried out on the side of the amplifier device.

It should be understood by those skilled in the art that various modifications, combinations, sub-combinations and alterations may occur depending on design requirements and other factors insofar as they are within the scope of the appended claims or the equivalents thereof.

The invention claimed is:

1. An audio signal reproducing system for use with a speaker device having a predetermined input-output characteristic, the predetermined input-output characteristic being such that linearity of an output signal level with respect to an input signal level is approximately maintained at a level higher than a predetermined level and such that the linearity of the output signal level with respect to the input signal level is not assured at a level less than the predetermined level, the system comprising:

means for reproducing an audio signal so as to form a reproduced audio signal; and means for performing a process on the reproduced audio signal so as to form a processed reproduced audio signal and for supplying the processed reproduced audio signal to the speaker device, the process including a correction process which compensates audio signal output levels having a value less than the predetermined level and which does not compensate audio signal output levels having a value higher than the predetermined level, in which the correction process involves forming the audio signal output levels having the value less than the predetermined level so as to be a reverse of that which existed prior to the correction process such that upon completion of the process the linearity of the output signal level with respect to the input signal level is approximately maintained at the level higher than the predetermined level and at the level less than the predetermined level, in which during operation said means for performing the process carries out the correction process uniformly in approximately all frequency bands which the speaker device outputs, and in which said means for performing includes a first filter, a second filter, a transformer, a first buffer amplifier and a second buffer amplifier each arranged on a primary side of the transformer, the first filter and the second filter being arranged between the first buffer amplifier and the second buffer amplifier, the first filter being an active filter and having a first operational amplifier, a second operational amplifier, a first capacitor, and a second capacitor arranged such that a connection point between the first buffer amplifier and the second buffer amplifier is connected to a first input terminal of the first operational amplifier through the first capacitor, an output terminal and a second input terminal of the first operational amplifier and an output terminal and a first input terminal of the second operational amplifier are connected, and a second input terminal of the second operational amplifier is grounded through the second capacitor, and the second filter having a first capacitor, a second capacitor, and a resistor arranged such that a connection point between the first buffer amplifier and the second buffer amplifier is grounded through the resistor and the first capacitor, and a connection between the resistor and the first capacitor is grounded through the second capacitor.

* * * * *